United States Patent
Nesarkar et al.

(10) Patent No.: US 12,455,119 B2
(45) Date of Patent: Oct. 28, 2025

(54) REGENERATOR FOR FORELINE HEATING

(71) Applicant: Applied Materials, Inc., Santa Clara, CA (US)

(72) Inventors: Santosh S. Nesarkar, Karnataka (IN); Harinath Reghunathannair, Karnataka (IN); Sathishkumar Kummamoorthy, Karnataka (IN)

(73) Assignee: Applied Materials, Inc., Santa Clara, CA (US)

( * ) Notice: Subject to any disclaimer, the term of this patent is extended or adjusted under 35 U.S.C. 154(b) by 240 days.

(21) Appl. No.: 18/206,861

(22) Filed: Jun. 7, 2023

(65) Prior Publication Data
US 2024/0337449 A1 Oct. 10, 2024

(30) Foreign Application Priority Data
Apr. 10, 2023 (IN) .............................. 202341026622

(51) Int. Cl.
*F28D 17/04* (2006.01)
*F28D 17/02* (2006.01)
(Continued)

(52) U.S. Cl.
CPC ............. *F28D 17/04* (2013.01); *F28D 17/02* (2013.01); *H01J 37/32522* (2013.01);
(Continued)

(58) Field of Classification Search
CPC .... F28D 17/04; F28D 17/02; H01J 37/32522; H01J 37/32834; H01J 2237/3341; H01L 21/67069
(Continued)

(56) References Cited

U.S. PATENT DOCUMENTS

| | | |
|---|---|---|
| 7,964,040 B2 | 6/2011 | Rasheed et al. |
| 9,322,571 B2 | 4/2016 | Lee |

(Continued)

FOREIGN PATENT DOCUMENTS

| | | |
|---|---|---|
| TW | 201243955 A1 | 11/2012 |
| WO | WO 2015175339 | 11/2015 |

OTHER PUBLICATIONS

Office Action in Taiwanese Appln. No. 113113336, dated Nov. 21, 2024, 5 pages (with English search report).

(Continued)

*Primary Examiner* — Jon T. Schermerhorn, Jr.
(74) *Attorney, Agent, or Firm* — Fish & Richardson P.C.

(57) ABSTRACT

Semiconductor processing systems and system components are described for providing regenerative heating to a foreline component. A system includes a plasma-based processing chamber. The processing chamber includes one or more fluid paths configured to circulate a heat transfer fluid. The system also includes one or more vacuum systems configured to exhaust process gases from the processing chamber, the one or more vacuum systems including one or more vacuum pumps and a foreline vent. The system includes a foreline regenerator. The foreline regenerator includes a regenerator shell at least partially surrounding the foreline vent, the regenerator shell including a heat transfer fluid input and a heat transfer fluid output, wherein the heat transfer fluid input is coupled to an output of the processing chamber.

20 Claims, 5 Drawing Sheets

(51) Int. Cl.
*H01J 37/32* (2006.01)
*H01L 21/67* (2006.01)

(52) U.S. Cl.
CPC .. *H01J 37/32834* (2013.01); *H01L 21/67069* (2013.01); *H01J 2237/3341* (2013.01)

(58) Field of Classification Search
USPC ............................................................ 165/4
See application file for complete search history.

(56) References Cited

U.S. PATENT DOCUMENTS

| | | | |
|---|---|---|---|
| 10,566,182 B2 * | 2/2020 | Goshi | H01L 21/02057 |
| 10,998,186 B2 * | 5/2021 | Goshi | H01L 21/67109 |
| 11,837,479 B2 | 12/2023 | Silveira et al. | |
| 12,062,567 B2 * | 8/2024 | Huang | H01L 21/67167 |
| 12,131,934 B2 * | 10/2024 | Woo | H01L 21/68 |
| 2009/0114155 A1 | 5/2009 | Sawayama et al. | |
| 2011/0311421 A1 | 12/2011 | Backhaus-Ricoult et al. | |
| 2019/0226083 A1 | 7/2019 | Dickinson | |
| 2021/0320027 A1 | 10/2021 | Huang et al. | |

OTHER PUBLICATIONS

International Search Report and Written Opinion in International Appln. No. PCT/US2024/023742, dated Jul. 23, 2024, 9 pages.

* cited by examiner

REGENERATOR FOR FORELINE HEATING

CROSS-REFERENCE TO RELATED APPLICATIONS

This application claims the benefit of priority under 35 U.S.C. § 119 to Indian Patent Application No. 202341026622, filed on Apr. 10, 2023, the contents of which are hereby incorporated by reference.

BACKGROUND

This specification relates to semiconductor systems, processes, and equipment.

Plasma etching can be used in semiconductor processing to fabricate integrated circuits. Integrated circuits can be formed from layer structures including multiple (e.g., two or more) layer compositions. Different etching gas chemistries, e.g., different mixtures of gases, can be used to form a plasma in the processing environment such that a given etching gas chemistry can have increased precision and higher selectivity for a layer composition to be etched. Plasma etching is typically performed within a low pressure processing chamber. One or more vacuum pumps exhaust gas molecules from the processing chamber through a foreline vent.

SUMMARY

This specification describes technologies for using excess heat energy from the heat transfer fluid used to heat a plasma processing chamber to heat a foreline component of a plasma-based processing system. A plasma-based processing system generates a plasma within a processing region to perform a particular process, e.g., plasma etching of a substrate held within the processing chamber. The processing chamber is coupled to a foreline which provides an exhaust path when generating and maintaining a vacuum within the processing chamber. Maintaining the vacuum includes evacuating byproducts generated from the plasma etching process. The byproducts can include various polymers. The foreline is heated to a temperature similar to the processing chamber temperature to prevent the exhausted byproducts from settling on or adhering to the inner lining of the foreline. If allowed to build up, the polymers could eventually adversely affect performance of the plasma-based processing system.

To maintain a required temperature within the processing chamber, the process chamber is heated by circulating a hot heat transfer fluid that transfers heat to the chamber and exits the processing chamber. This specification describes technologies for routing the heated heat transfer fluid exiting the processing chamber and into a foreline regenerator shell before passing the fluid to a heat exchanger. Thus, the foreline is heated using a regenerative heater that makes use of waste heat retained by the heat transfer fluid to provide heating.

In general, one innovative aspect of the subject matter described in this specification can be embodied in a system for semiconductor processing. The system includes a plasma-based processing chamber, the processing chamber including one or more fluid paths configured to circulate a heat transfer fluid. The system also includes one or more vacuum systems configured to exhaust process gases from the processing chamber, the one or more vacuum systems including one or more vacuum pumps and a foreline vent. The system further includes a foreline regenerator that includes a regenerator shell at least partially surrounding the foreline vent. The regenerator shell includes a heat transfer fluid input and a heat transfer fluid output. The heat transfer fluid input is coupled to an output of the processing chamber.

In general, one innovative aspect of the subject matter described in this specification can be embodied in a foreline regenerator that includes a shell surrounding at least a portion of a foreline vent of a plasma-based processing system. The shell is configured to provide a spacing between an outer surface of the foreline vent and an inner surface of the shell. The foreline regenerator also includes a heat transfer fluid input port configured to receive heat transfer fluid and input the heat transfer fluid to the spacing. The foreline regenerator also includes a heat transfer fluid output port configured to output heat transfer fluid from the spacing.

In general, one innovative aspect of the subject matter described in this specification can be embodied in a method of heating a foreline component. The method includes receiving heat transfer fluid output from a plasma-based substrate processing chamber at an input port of a regenerator. The method further includes flowing the heat transfer fluid between the input port of the regenerator and an output port of the regenerator to heat the foreline component. Flowing the heat transfer fluid includes passing the heat transfer fluid from the input port to a regenerator shell. The regenerator shell includes a shell that at least partially surrounds the foreline component, the shell providing a fluid path within a spacing between an outer surface of the foreline component and an inner surface of the shell. The method includes outputting the heat transfer fluid from an output port of the regenerator.

The subject matter described in this specification can be implemented in these and other embodiments so as to realize one or more of the following advantages. Heating a foreline prevents processing byproducts in the exhaust from adhering to inner surfaces of the foreline. Using a regenerative heating process that circulates heat transfer fluid from the processing chamber allows the foreline to be heated to substantially the same temperature as the processing chamber, which prevents byproduct settling. Use of waste heat from the processing chamber eliminates the need for one or more separate electrical heaters positioned around the foreline. This reduces both fabrication and operational costs. Furthermore, as opposed to separate electrical heaters, using the heat from the heat transfer fluid can eliminate the need to adjust the heater temperature because the processing chamber provides heat transfer fluid at a constant temperature. Additionally, using waste heat allows for an environmentally friendly and sustainable solution that doesn't require excess power.

Although the remaining disclosure will describe the innovative technologies in the context of a particular type of plasma-based processing chamber using the disclosed technology, it will be readily understood that the systems and methods are equally applicable to a variety of other types of plasma-based substrate processing chambers. Accordingly, the technology should not be considered to be so limited as for use with the described etch-based processing alone. The disclosure will discuss one possible system and chamber that can be used with the present technology before describing systems and methods or operations of exemplary process sequences according to some embodiments of the present technology. It is to be understood that the technology is not limited to the equipment described, and processes discussed can be performed in any number of processing chambers and systems.

BRIEF DESCRIPTION OF THE DRAWINGS

Like reference numbers and designations in the various drawings indicate like elements.

DETAILED DESCRIPTION

The present specification describes technologies for using excess heat from a plasma processing chamber to heat a foreline component of a plasma-based processing system. The foreline is coupled to one or more vacuum components of a plasma-based processing system and is used to vent gases and byproducts pumped out of the processing chamber. At least a portion of the foreline is surrounded by a regenerator shell. Hot heat transfer fluid exiting the processing chamber is circulated within the regenerator shell to provide heating to the foreline. The heating prevents processing byproducts from adhering to the inner walls of the foreline.

Figure 1:
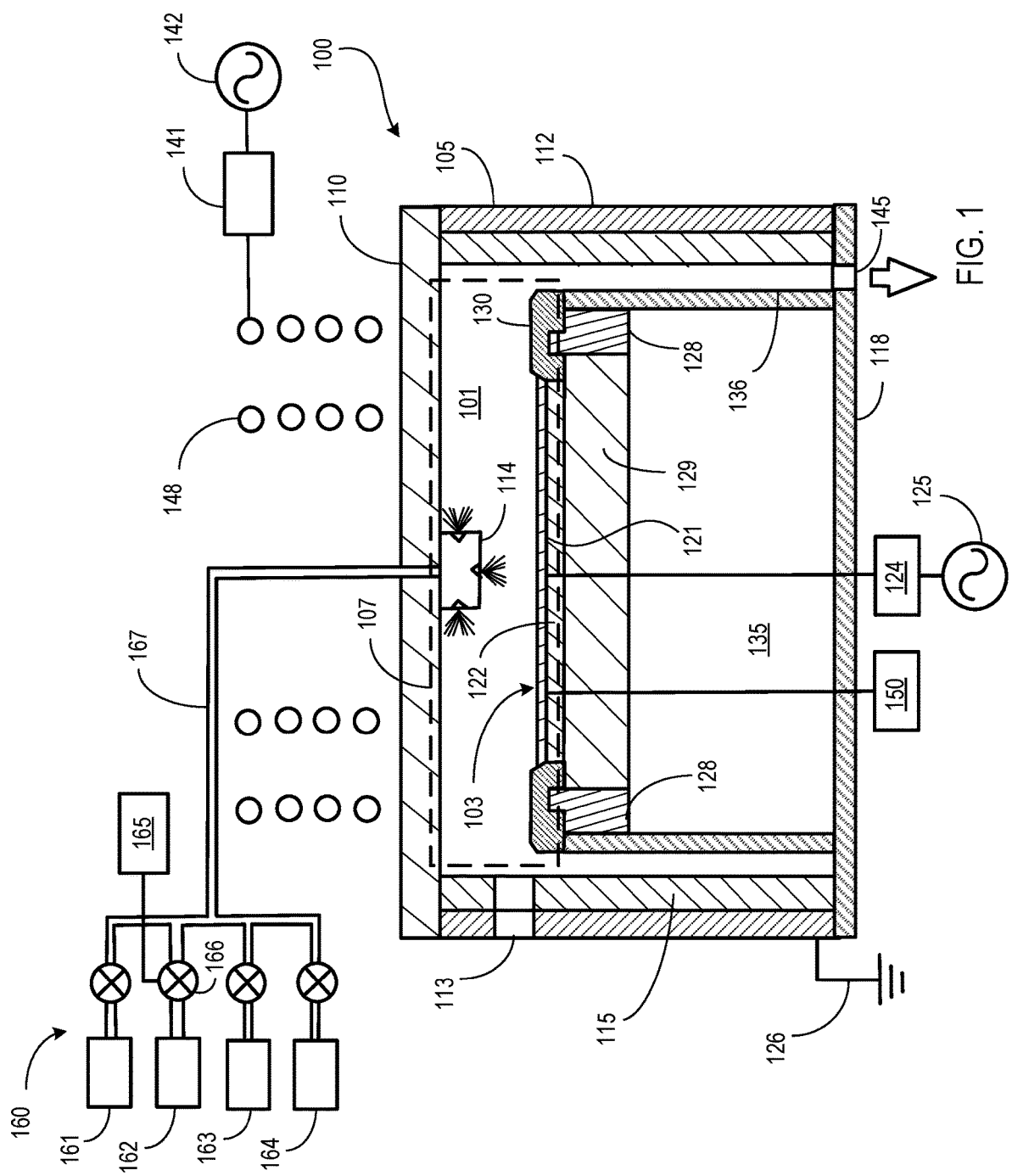
FIG. 1 shows a schematic cross-sectional view of an example processing chamber.

FIG. 1 illustrates a schematic cross-sectional view of an example processing chamber 100 suitable for etching one or more material layer(s) disposed on a substrate 103 (e.g., also referred to as a "wafer") in the processing chamber 100, e.g., a plasma processing chamber. The processing chamber 100 includes a chamber body 105 defining a chamber volume 101 in which a substrate can be processed. The chamber body 105 has sidewalls 112 and a bottom 118 which are coupled with ground 126. The sidewalls 112 can include a liner 115 to protect the sidewalls 112 and extend the time between maintenance cycles of the plasma processing chamber 100. The chamber body 105 is supportive of a chamber lid 110 to enclose the chamber volume 101. The chamber body 105 can be fabricated from, for example, aluminum or other suitable materials. A substrate access port 113 is formed through the sidewall 112 of the chamber body 105, which can facilitate the transfer of the substrate 103 into and out of the plasma processing chamber 100. Access port 113 can be coupled with a transfer chamber and/or other chambers (not shown) of a substrate processing system, e.g., to perform other processes on the substrate. A pumping port 145 is formed through the bottom 118 of the chamber body 105 and connected to the chamber volume 101. A pumping device can be coupled through the pumping port 145 to the chamber volume 101 to evacuate and control the pressure within the processing volume. The pumping device can include one or more vacuum pumps and throttle valves that output gasses and processing byproducts to a foreline vent.

Chamber volume 101 includes a processing region 107, e.g., a station for processing a substrate. A substrate support 135 can be disposed in the processing region 107 of chamber volume 101 to support the substrate 103 during processing. The substrate support 135 can include an electrostatic chuck 122 for holding the substrate 103 during processing. The electrostatic chuck ("ESC") 122 can use the electrostatic attraction to hold the substrate 103 to the substrate support 135. The ESC 122 can be powered by a radio frequency ("RF") power supply 125 integrated with a match circuit 124. The ESC 122 can include an electrode 121 embedded within a dielectric body. The electrode 121 can be coupled with the RF power supply 125 and can provide a bias which attracts plasma ions, formed from the process gases in the chamber volume 101, to the ESC 122 and substrate 103 seated on the pedestal. The RF power supply 125 can cycle on and off, or pulse, during processing of the substrate 103. The ESC 122 can have an isolator 128 for the purpose of making the sidewall of the ESC 122 less attractive to the plasma to prolong the maintenance life cycle of the ESC 122. Additionally, the substrate support 135 can have a cathode liner 136 to protect the sidewalls of the substrate support 135 from the plasma gases and to extend the time between maintenance of the plasma processing chamber 100.

Electrode 121 can be coupled with a DC power source 150. The power source 150 can provide a chucking voltage of about 200 volts to about 2000 volts to the electrode 121. The power source 150 can also include a system controller for controlling the operation of the electrode 121 by directing a DC current to the electrode 121 for chucking and de-chucking the substrate 103. The ESC 122 can include heaters disposed within the ESC 122 and connected to a power source for heating the substrate, while a cooling base 129 supporting the ESC 122 can include conduits for circulating a heat transfer fluid to maintain a temperature of the ESC 122 and substrate 103 disposed thereon. The ESC 122 can be configured to perform in the temperature range required by the thermal budget of the device being fabricated on the substrate 103. For example, the ESC 122 can be configured to maintain the substrate 103 at a temperature of about −150° C. or lower to about 500° C. or higher depending on the process being performed. A cover ring 130 can be disposed on the ESC 122 and along the periphery of the substrate support 135. The cover ring 130 can be configured to confine etching gases to a desired portion of the exposed top surface of the substrate 103, while shielding the top surface of the substrate support 135 from the plasma environment inside the plasma processing chamber 100.

A gas panel 160 (e.g., also referred to herein as "gas distribution manifold") can be coupled by a gas line 167 with the chamber body 105 through chamber lid 110 to supply process gases into the chamber volume 101. The gas panel 160 can include one or more process gas sources 161, 162, 163, 164 and can additionally include inert gases, non-reactive gases, and reactive gases, as can be used for any number of suitable processes. Examples of process gases that can be provided by the gas panel 160 include, but are not limited to, hydrocarbon containing gases including methane, sulfur hexafluoride, silicon chloride, silicon tetrachloride, carbon tetrafluoride, hydrogen bromide. Process gases that can be provided by the gas panel can include, but are limited to, argon gas, chlorine gas, nitrogen, helium, or oxygen gas, sulfur dioxide, as well as any number of additional materials. Additionally, process gasses can include nitrogen, chlorine, fluorine, oxygen, or hydrogen containing gases including, for example, $BCl_3$, $C_2F_4$, $C_4F_8$, $C_4F_6$, $CHF_3$, $CH_2F_2$, $CH_3F$, $NF_3$, $NH_3$, $CO_2$, $SO_2$, $CO$, $N_2$, $NO_2$, $N_2O$, and $H_2$, among any number of additional suitable precursors. Process gases from process gas sources, e.g., sources 161, 162, 163, 164, can be combined to form one or more etching gas mixtures. For example, gas panel 160 includes one or more process gas sources specific to oxide-based etching chemistries. In another example, gas panel 160 includes one or more process gas sources specific to nitride-based etching chemistries.

Gas panel 160 includes various valves and other components to control the flow of the process gases from the sources. Valves 166 can control the flow of the process gases from the gas sources 161, 162, 163, 164 from the gas panel 160. Operations of the valves, pressure regulators, and/or mass flow controllers can be controlled by a controller 165. Controller 165 can be operably coupled to an electro-valve (EV) manifold (not shown) to control actuation of one or more of the valves, pressure regulators, and/or mass flow controllers.

The lid 110 can incorporate a gas delivery nozzle 114. The gas delivery nozzle 114 can include one or more openings for introducing the process gases from the sources 161, 162, 163, 164 of the gas panel 160 into the chamber volume 101. After the process gases are introduced into the plasma processing chamber 100, the gases can be energized to form a plasma. An antenna 148, such as one or more inductor coils, can be provided adjacent to the plasma processing chamber 100. An antenna power supply 142 can power the antenna 148 through a match circuit 141 to inductively couple energy, such as RF energy, to the process gas to maintain a plasma formed from the process gas in the chamber volume 101 of the plasma processing chamber 100. The operation of the power supply 142 can be controlled by a controller, such as controller 165, that also controls the operation of other components in the plasma processing chamber 100.

While an inductively coupled plasma source is illustrated by FIG. 1, the general chamber and foreline described below can be used with other types of plasma sources including a capacitively coupled plasma source.

The controller 165 can be used to control the process sequence, regulating the gas flows from the gas panel 160 into the plasma processing chamber 100, and other process parameters. Software routines, when executed by a computing device having one or more processors (e.g., a central processing unit (CPU)) in data communication with one or more memory storage devices, transform the computing device into a specific purpose computer such as a controller, which can control the plasma processing chamber 100 such that the processes are performed in accordance with the present disclosure. The software routines can also be stored and/or executed by one or more other controller(s) that can be associated with the plasma processing chamber 100.

In some embodiments, at a termination point of etching process(es) for the wafer, an automatic or semi-automatic robotic manipulator (not shown) can be utilized to transfer the wafer(s) from the substrate support out of the process chamber, e.g., through substrate access port 113. For example, the robotic manipulator can transfer the wafer to another chamber (or another location) to perform another step in a fabrication process.

Although described with respect to FIG. 1 as a process chamber including a substrate support disposed within a processing region of the chamber volume, two or more substrate supports can be disposed within the same chamber volume in respective processing regions, e.g., in respective processing stations. For example, a processing chamber 100 can be a tandem processing chamber including two processing regions each with respective substrate supports configured to retain respective wafers during etching process(es). The processing chamber 100 can include two or more processing regions within the chamber volume 101 to facilitate parallel processing of two or more substrates in respective processing regions. The processing regions can be substantially isolated such that an etching process in a first processing region has minimal effect on an etching process in a second processing region and vice-versa. In a tandem processing chamber there can be two separate forelines, one for each processing region. Each can include a foreline regenerator.

Figure 2:
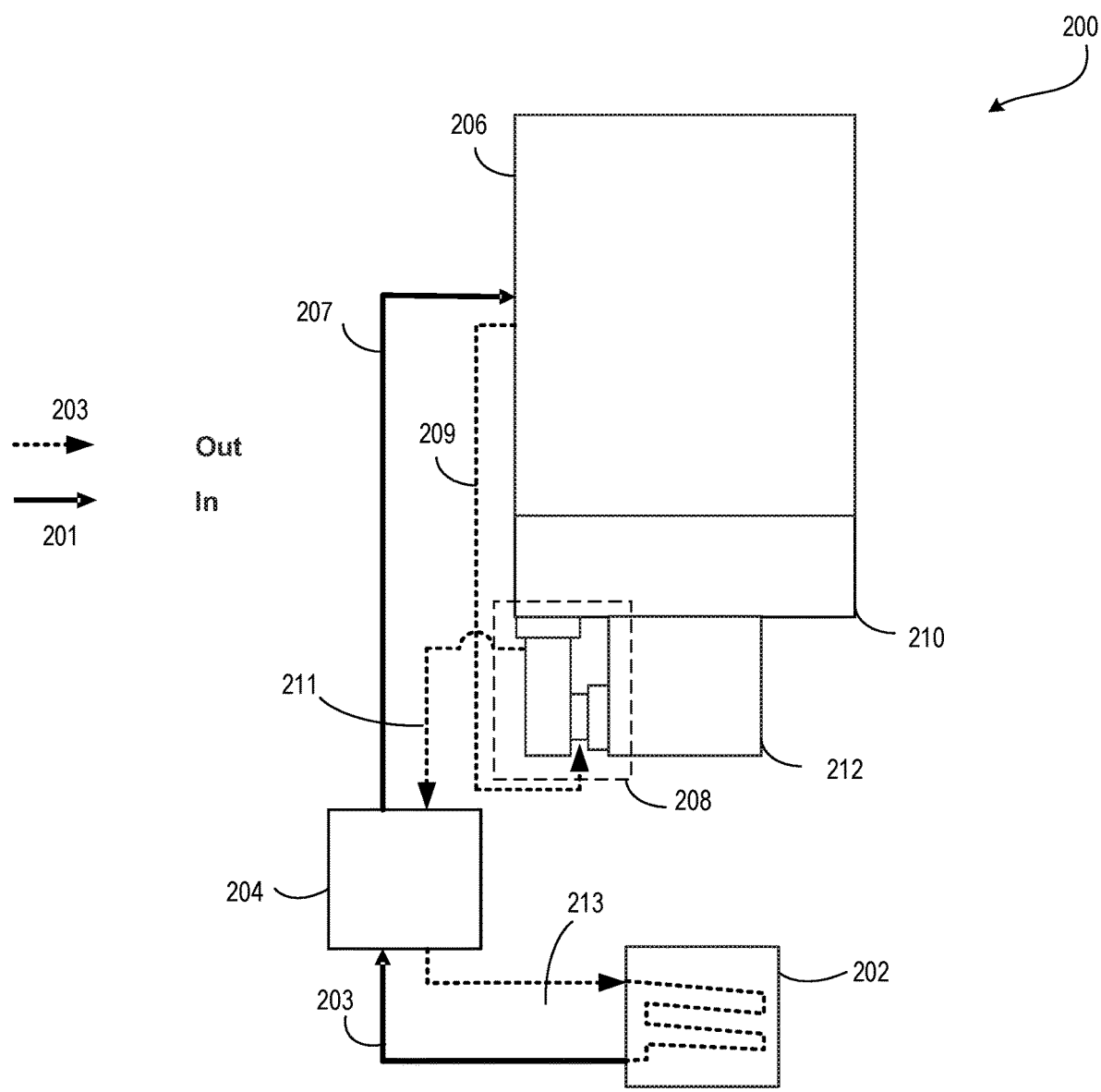
FIG. 2 shows a schematic diagram of an example heat transfer loop for a plasma-based processing system.

FIG. 2 shows a schematic diagram of an example heat transfer loop 200 for a plasma-based processing system. The heat transfer loop includes a heat transfer fluid "in" path 201 and a heat transfer fluid "out" path 203.

The heat transfer fluid "in" path 201 begins with a fluid line 205 exiting a heat exchanger 202 for passing a heat transfer fluid. In some implementations, the heat transfer fluid exiting the heat exchanger 202 has a temperature corresponding to a specified temperature for a processing chamber. The temperature of the heat transfer fluid can be, for example, 65 degrees or 90 degrees Celsius.

The heat exchanger 202 receives heat transfer fluid at an input port and outputs heat transfer fluid having a specific temperature at an output port coupled to the fluid line 205. The heat exchanger 202 can be, for example, a chamber that allows heat to pass between the heat transfer fluid and another heat transfer fluid within the heat exchanger 202 without the two fluids coming into direct contact. For example, the chamber can have a path that carries the heat transfer fluid from the input port to the output port. The path can be a coil, zigzag, or other path that lengthens the path the heat transfer fluid takes through the chamber. The chamber can also include a second heat transfer fluid that circulates through the chamber and around the path. Heat is exchanged to achieve a desired output temperature of the heat transfer fluid.

The fluid line 205 is coupled to a facility box 204, for example, for the plasma based processing system. The facility box 204 provides a manifold for connecting components of the plasma-based processing system to external components. Thus, for example, the facility box 204 allows for the coupling of the fluid line 205 to the plasma-based processing system. In some alternative implementations, the heat exchanger can be integrated within the plasma-based processing system so that the facility box 204 is not necessary to couple the fluid line to the heat exchanger.

Fluid line 207 exits the facility box 204 and is input into the processing chamber 206. The processing chamber 206 can be, for example, similar to processing chamber 100 of FIG. 1. In some implementations, the processing chamber is heated by the heat transfer fluid to maintain a particular chamber temperature, e.g., 65 or 90 degrees Celsius.

The fluid "out" path 203 begins with heat transfer fluid exiting the processing chamber 206 and into fluid line 209. Fluid line 209 couples the processing chamber 206 to an input to a foreline regenerator, illustrated within box 208. The foreline includes a regenerator shell that at least partially surrounds the foreline so that the heat transfer fluid input to the foreline fills a space between the regenerator shell and the outer surface of the foreline. The fluid line 209, and optionally other fluid lines, can be insulated to reduce a heat loss over the distance from the processing chamber 206 to the foreline regenerator. The loss over a short distance may be negligible so that heat transfer fluid temperature entering the foreline regenerator is substantially the same as the heat transfer fluid temperature leaving the processing chamber 206. Therefore, if the temperature of the processing chamber is held constant, the heat transfer fluid temperature is also constant.

The foreline is coupled to a flow valve 210 and a turbomolecular pump, referred to in this specification as a turbo pump, 212 as part of the vacuum components of the plasma-based processing system. The flow value 210 and turbo pump 212 provide inputs to the foreline as they provide venting from the processing chamber 206. The foreline further includes an output vent for outputting the vented gases and processing byproducts. The vacuum components are described further with respect to FIG. 3. The output vent can be coupled to one or more other external systems that treat the exhaust, for example, to remove byproducts and recover particular process gases.

Heat transfer fluid exits the regenerator into fluid line 211. Fluid line 211 couples the foreline regenerator with the facility box 204. Fluid line 213 couples the facility box 204 with an input of the heat exchanger 202, completing a heat transfer loop, e.g., as a closed loop system.

Figure 3:
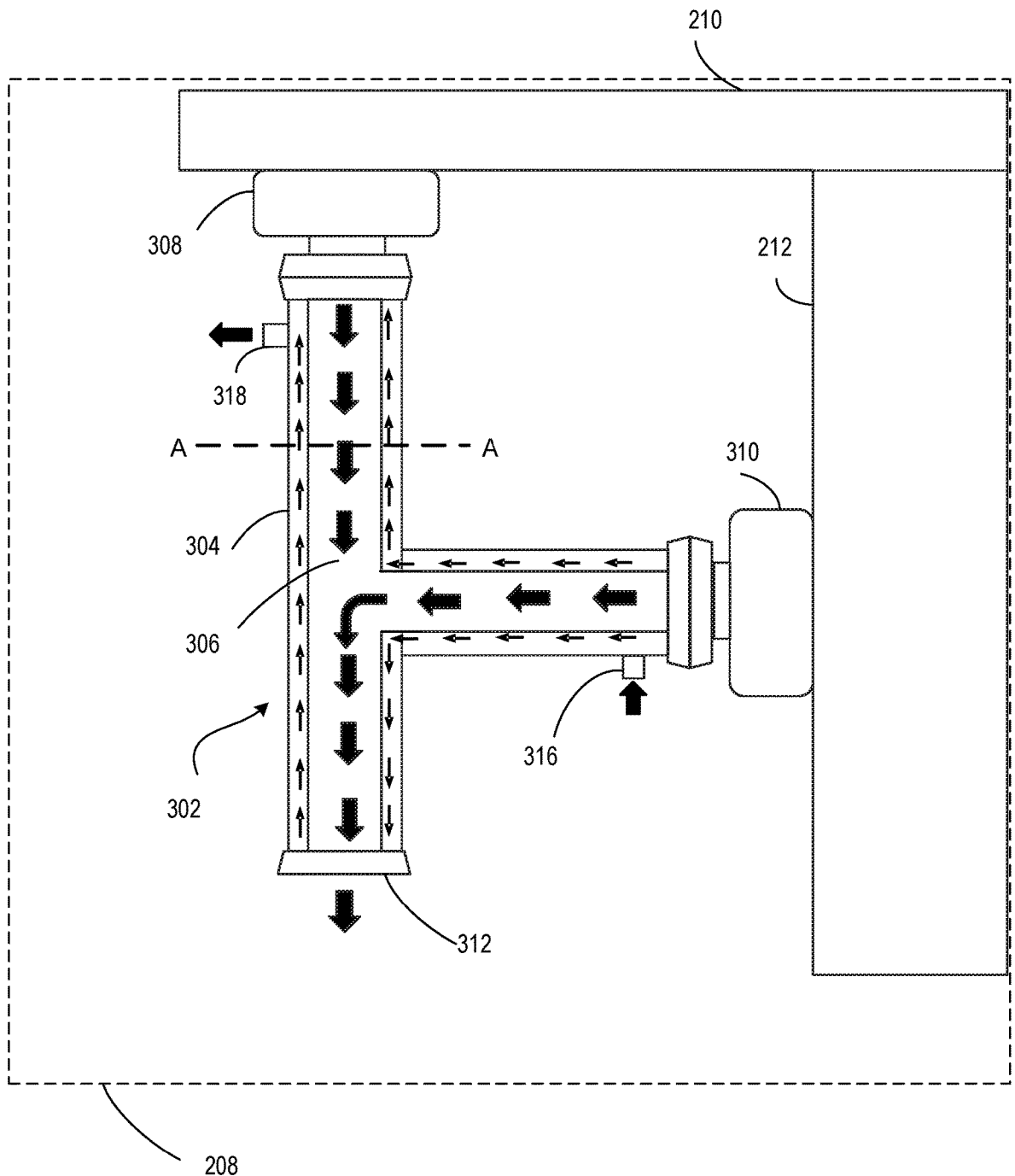
FIG. 3 shows a schematic cross-sectional view of an example foreline with a regenerative heater shell.

FIG. 3 shows a schematic cross-sectional view 300 of an example foreline with a regenerative heater. In particular, cross-sectional view 300 represents an enlarged view of the components within box 208 of FIG. 2.

A regenerative foreline 302 includes a regenerator shell 304 and a foreline 306. The foreline 306 is coupled to a first isolation valve 308 and a second isolation valve 310. The first isolation valve 308 is coupled to the flow valve 210. The second isolation valve 310 is coupled to do the turbo pump 212. The foreline 306 is further coupled to exhaust port 312. In some implementations, process gases of the plasma processing chamber can be recovered from the exhaust. In some implementations, the foreline 306 is fabricated from stainless steel. For example, the foreline can be fabricated from SST 316L, which is a particular alloy of stainless steel that contains molybdenum and has good corrosion resistance.

During operation of a plasma processing chamber, e.g., plasma processing chamber 206, a vacuum is formed within the processing chamber. Based on the level of vacuum needed, a multi-step process can be used to form the vacuum. For example, an initial roughing pump can be used to reach a first pressure level within the processing chamber, e.g., to reduce the pressure to substantially 100 mTorr. The first level of vacuum created by the roughing pump bypass turbo pump 212 and are directed to the foreline 306 though first isolation valve 308. During the roughing process, the first isolation valve the first isolation valve 308 can be open while the second isolation valve 310 can be closed. In some implementations, the flow valve 210 is a symmetric flow valve that provides for high throughput with reduced choked flow between the processing chamber and a vacuum pump.

A second vacuum stage to achieve a greater vacuum can be performed by the turbo pump 212. During the second vacuum stage, the first isolation valve 308 can be closed and the second isolation valve 310 can be opened. Gas molecules from the processing chamber pass through the flow valve 210 and are output by the turbo pump 212 to the foreline 306 through the second isolation valve 310.

After forming the vacuum having a specified pressure, the turbo pump 212 maintains the pressure in the processing chamber. As noted above, in a plasma processing chamber, a processing operation can be performed on a substrate using a plasma. Particular process gases are input to the chamber. Byproducts of the input process gases are exhausted by the turbo pump 212 through the foreline 306 to maintain the specified pressure within the processing chamber as well as preventing additional matter of the processing byproducts from interfering with the plasma processing operation.

A particular processing operation can be configured for a set temperature in the processing chamber, for example, 65° C. or 90° C. To maintain the desired temperature, a chamber body of the processing chamber includes a fluid path through which a heat transfer fluid continuously circulates, e.g., to remove excess heat generated by the plasma processing. The heat transfer fluid can be selected according to particular performance parameters such as an ability to operate in particular temperature ranges and chemical stability. The heat transfer fluid can be, for example, a fluorinated fluid such as perfluoropolyether including Galden® PFPE.

Without heating the foreline 306, byproducts in the hot exhaust passing through the foreline can cool and adhere on the inner surface of the foreline 306. The foreline 306 is therefore heated to prevent the byproducts from settling on the inner surface of the foreline 306.

Regenerator shell 304 encloses the sidewalls of the foreline 306. The regenerator shell 304 provides a space between the outer surface of the foreline sidewalls and the regenerator shell 304. An input port 316 supplies hot heat transfer fluid that has exited the processing chamber to fill the space between the outer surface of the foreline sidewalls and the regenerator shell 304. The heat transfer fluid entering the regenerator shell 304 can be substantially equal to the temperature of the processing chamber, e.g., 65° C. or 90° C.

Figure 4:
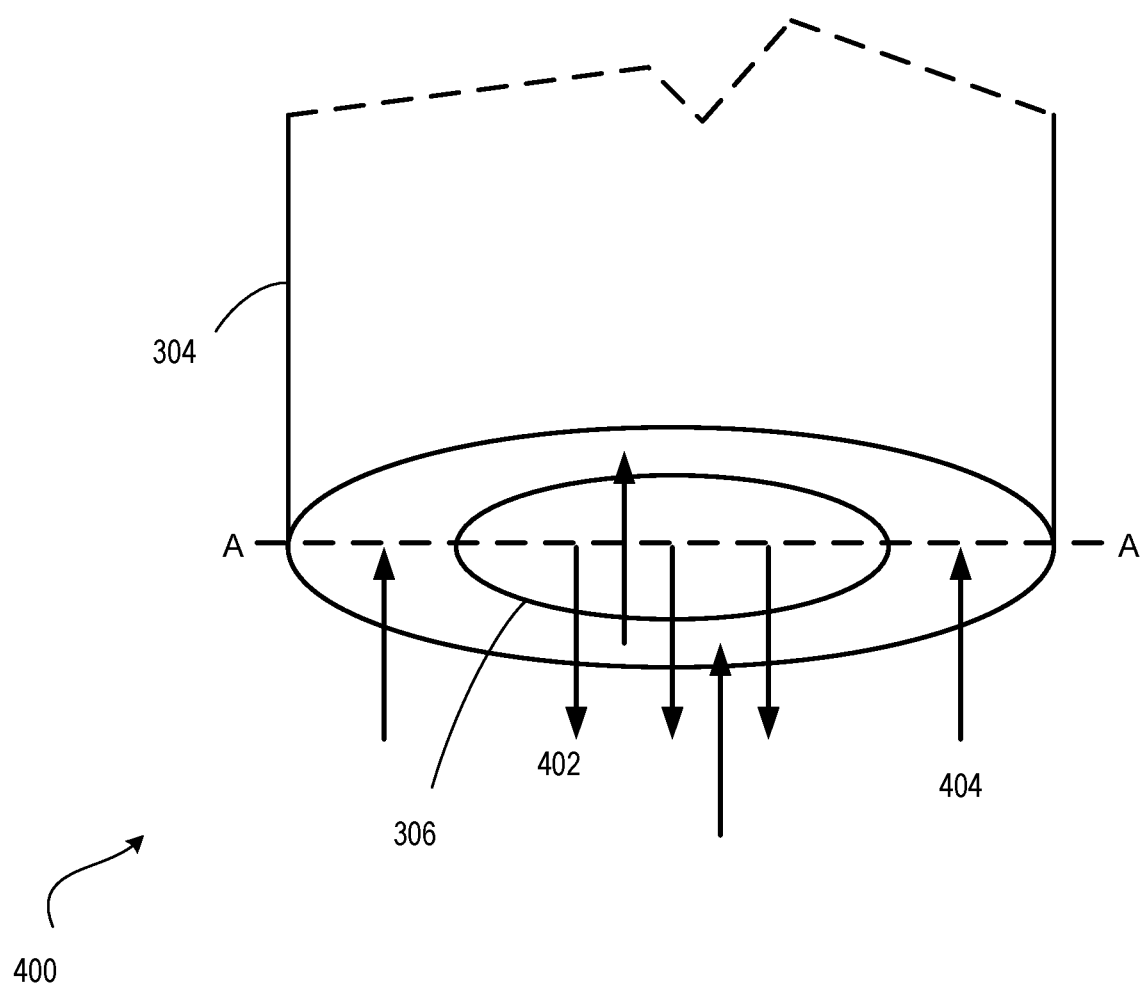
FIG. 4 shows a cross-sectional view of the example regenerative foreline shown in FIG. 3 along line A-A.

FIG. 4 shows a cross-sectional view 400 of the example regenerative foreline 302 shown in FIG. 3 along line A-A. As illustrated by the cross-sectional view 400, the regenerator shell 304 surrounds the foreline 306. Exhaust gases 402 pass through the foreline 306 toward the exhaust port. Heat transfer fluid 404 heats the foreline as it fills the space between the foreline 306 and the regenerator shell 304.

The hot heat transfer fluid fills the space formed by the regenerator shell 304 until it reaches an output port 318. Heat transfer fluid output from the regenerator shell proceeds to a heat exchanger, after which it can loop back to the processing chamber, e.g., as illustrated in FIG. 2.

In the example regenerator shell shown in FIG. 3, the input port 316 is positioned near the second isolation valve 310. However, the input port 316 can be positioned in other locations, for example, near the exhaust port 312. The output port 318 is shown near the first isolation valve 308 so that the entire shell can be filled with heat transfer fluid. However, in some implementations, the output port can be positioned in another location.

The regenerator shell 304 can be a single layer of material or multiple layers. For example, the inner layer of the regenerator shell 304 can be metal that is surrounded by an insulating layer to help maintain the heating of the foreline 306. In some implementations, an inner layer is composed of stainless steel. Alternatively, for a single layer shell, the entire body can be composed of stainless steel. Similar to the foreline, the regenerator shell can be formed of a particular stainless steel alloy such as SST 316.

In some alternative implementations, the regenerator shell 304 can include an insulated outer shell layer and a coiled inner tubing that wraps around the foreline. The heat transfer fluid can pass from the input port to the output port through the coil, which is heated by the fluid. The heat is then transferred to the foreline.

Figure 5:
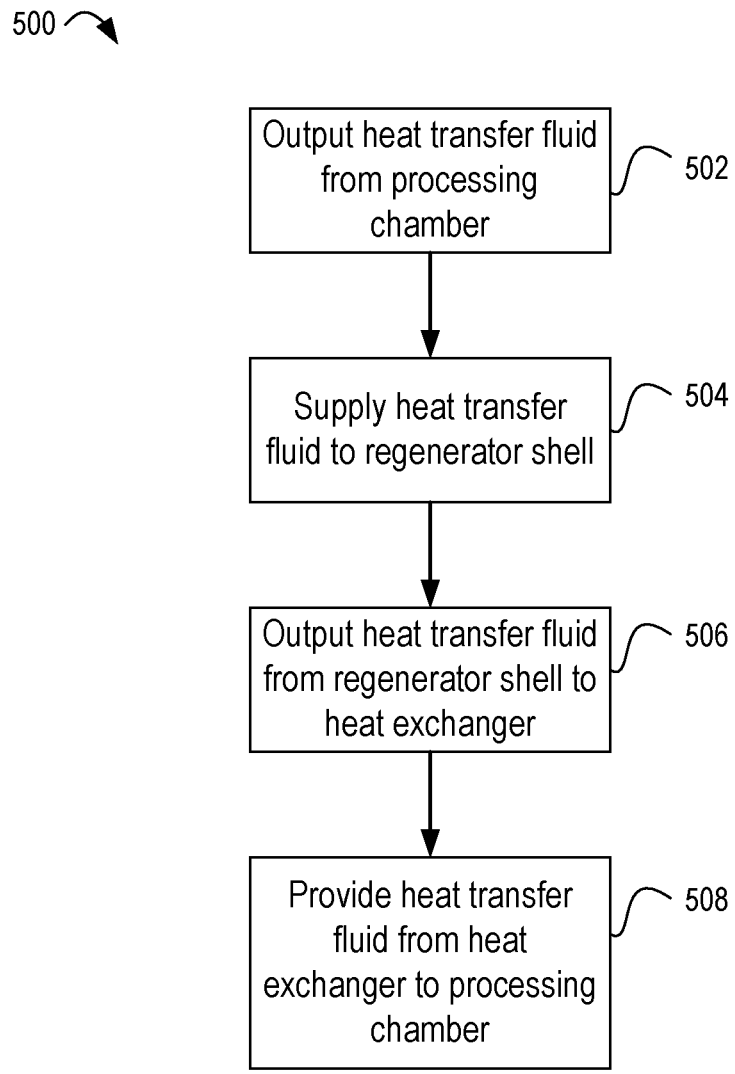
FIG. 5 is a flow diagram of an example process for heating a foreline.

FIG. 5 is a flow diagram of an example process 500 for heating a foreline. For convenience, the process 500 will be described with respect to a system that performs the process 500, e.g. a cooling and heating system for a plasma-based processing system.

The system draws hot heat transfer fluid from a plasma-based processing chamber (502). The plasma-based processing chamber can be maintained at a particular temperature, for example, 65° C. or 90° C. A fluid line can input heat transfer fluid to the plasma-based processing chamber. For example, the processing chamber sidewalls can include a fluid path that allows the heat transfer fluid to absorb excess heat from the plasma-based processing chamber as it passes through the fluid path. The heat transfer fluid is then output from the plasma-based processing chamber.

The system supplies the hot heat transfer fluid to a regenerator shell to heat the foreline (504). The heat transfer fluid fills a space surrounding at least a portion of the foreline to heat the foreline. Heating the foreline can prevent processing byproducts present in vacuum exhaust form adhering to the inner walls of the foreline. The hot heat transfer fluid can enter the regenerator shell at a lower point, with respect to the ground, and exit at a higher point to ensure that the heat transfer fluid rises to surround the foreline as it progresses to an output.

Because the processing chamber is maintained at a particular temperature, the temperature of the outgoing heat transfer fluid is generally known and constant. Using insulated fluid lines reduces heat loss between the processing chamber and the regenerator shell so that a consistent heat transfer fluid temperature is provided to the regenerator shell. As a result, there may be no need for temperature monitoring or adjustment to the regenerator shell because the temperature supplied is known and constant.

The system outputs the heat transfer fluid from the regenerative shell and directs the heat transfer fluid to a heat exchanger (506). The heat exchanger transfers heat so that the heat transfer fluid exiting the heat exchanger has a specified temperature for looping back to the processing chamber temperature. One or more intermediate components may be positioned between the regenerator shell and the heat exchanger. For example, a facilities connection point can serve as a coupling point between components within the plasma processing system and external components, e.g., an external heat exchanger.

The system provides heat transfer fluid from the heat exchanger to the plasma-based processing chamber (508). The heat transfer fluid exiting the heat exchanger is routed back to the plasma-based processing chamber to complete a heat transfer loop. Again, the heat transfer fluid can be routed through one or more intermediate components such as the facilities connection point, prior to reaching a heat transfer fluid input of the plasma-based processing chamber.

While this specification contains many specific implementation details, these should not be construed as limitations on the scope of what is being claimed, which is defined by the claims themselves, but rather as descriptions of features that can be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features can be described above as acting in certain combinations and even initially be claimed as such, one or more features from a claimed combination can in some cases be excised from the combination, and the claim can be directed to a subcombination or variation of a subcombination.

Similarly, while operations are depicted in the drawings and recited in the claims in a particular order, this by itself should not be understood as requiring that such operations be performed in the particular order shown or in sequential order, or that all illustrated operations be performed, to achieve desirable results. In certain circumstances, multitasking and parallel processing can be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing can be advantageous.

What is claimed is:

1. A system comprising:
a plasma-based processing chamber, the plasma-based processing chamber comprising one or more fluid paths configured to circulate a heat transfer fluid;
one or more vacuum systems configured to exhaust process gases from the plasma-based processing chamber, the one or more vacuum systems comprising one or more vacuum pumps and a foreline vent; and
a foreline regenerator comprising:
a regenerator shell at least partially surrounding the foreline vent, the regenerator shell including a heat transfer fluid input and a heat transfer fluid output, wherein the heat transfer fluid input is coupled to an output of the plasma-based processing chamber.

2. The system of claim 1, wherein the regenerator shell provides a spacing between an inner surface of the regenerator shell and an outer surface of the foreline vent.

3. The system of claim 2, wherein heat transfer fluid input to the heat transfer fluid input fills the spacing between the inner surface of the regenerator shell and an outer surface of the foreline vent and between the heat transfer fluid input and the heat transfer fluid output.

4. The system of claim 1, wherein the foreline vent comprises a first exhaust branch coupled to a roughing vacuum pump, a second exhaust branch coupled to a turbo pump, and a vent coupled to the first and second exhaust branches, wherein the heat transfer fluid input is positioned proximate to the second exhaust branch and the heat transfer fluid output is positioned proximate to the first exhaust branch.

5. The system of claim 1, comprising an insulated fluid line coupling the heat transfer fluid output of the plasma-based processing chamber with the heat transfer fluid input of the regenerator shell.

6. The system of claim 1, further comprising one or more fluid lines coupling the heat transfer fluid output of the regenerator shell to a heat exchanger and one or more fluid lines coupling the heat exchanger to an input of the plasma-based processing chamber, wherein collection of fluid lines completes a heat transfer loop.

7. The system of claim 1, the foreline regenerator further comprising a coiled fluid path coupling the heat transfer fluid input and the heat transfer fluid output, the coiled fluid path being positioned within a space between the regenerator shell and the foreline vent.

8. A foreline regenerator comprising:
a shell surrounding at least a portion of a foreline vent of a plasma-based processing system, the shell configured to provide a spacing between an outer surface of the foreline vent and an inner surface of the shell;

a heat transfer fluid input port configured to receive heat transfer fluid and input the heat transfer fluid to the spacing; and a heat transfer fluid output port configured to output heat transfer fluid from the spacing.

9. The foreline regenerator of claim 8, wherein heat transfer fluid input to the heat transfer fluid input port fills the spacing between the inner surface of the shell and an outer surface of the foreline vent and between the heat transfer fluid input and the heat transfer fluid output port.

10. The foreline regenerator of claim 8, wherein the foreline regenerator heats the foreline vent to a consistent temperature of substantially 65 degrees Celsius during operation.

11. The foreline regenerator of claim 8, wherein the heat transfer fluid input port is positioned relative to a portion of the foreline vent proximate to a turbomolecular vacuum pump exhaust.

12. The foreline regenerator of claim 11, wherein the heat transfer fluid output port is positioned relative to a portion of the foreline vent proximate to a roughing pump exhaust.

13. The foreline regenerator of claim 8, wherein the shell comprises an inner layer formed from stainless steel and an outer insulating layer.

14. The foreline regenerator of claim 8, wherein the spacing includes a coil shaped fluid path that wraps around the foreline vent and couples the heat transfer fluid input port to the heat transfer fluid output port.

15. A method of heating a foreline component comprising:
receiving heat transfer fluid output from a plasma-based substrate processing chamber at an input port of a regenerator;
flowing the heat transfer fluid between the input port of the regenerator and an output port of the regenerator to heat the foreline component, wherein flowing the heat transfer fluid comprises passing the heat transfer fluid from the input port to a regenerator shell, the regenerator shell comprising a shell that at least partially surrounds the foreline component, the shell providing a fluid path within a spacing between an outer surface of the foreline component and an inner surface of the shell; and
outputting the heat transfer fluid from an output port of the regenerator.

16. The method of claim 15, wherein receiving the heat transfer fluid output from a plasma-based substrate processing chamber comprises passing the heat transfer fluid through an insulated fluid line from the plasma-based substrate processing chamber to the input port of the regenerator.

17. The method of claim 15, wherein flowing the heat transfer fluid between the input port of the regenerator and the output port of the regenerator heats the foreline component to substantially 65 degrees Celsius.

18. The method of claim 15, wherein the output port of the regenerator is coupled to a heat exchanger, and wherein the heat exchanger is coupled to an input of the plasma-based substrate processing chamber, the method further comprising circulating heat transfer fluid in closed loop between the plasma-based substrate processing chamber, the regenerator, and the heat exchanger.

19. The method of claim 15, wherein the heat transfer fluid output from the plasma-based substrate processing chamber has a constant temperature so that the foreline component is also heated to a constant temperature.

20. The method of claim 15, wherein flowing the heat transfer fluid between the input port of the regenerator and the output port of the regenerator comprises inputting the heat transfer fluid at a lower point in the regenerator relative to ground and outputting the heat transfer fluid at a higher point in the regenerator relative to the ground.

* * * * *